United States Patent [19]

Romano

[11] 4,321,320
[45] Mar. 23, 1982

[54] PROCESS FOR SURFACE IMPROVEMENT OF SURPRINT PROOF INVOLVES EXPOSURE THRU HALFTONE SCREEN TINT

[75] Inventor: Albert P. Romano, Pitman, N.J.
[73] Assignee: E. I. Du Pont de Nemours and Company, Wilmington, Del.
[21] Appl. No.: 189,828
[22] Filed: Sep. 23, 1980
[51] Int. Cl.³ .............................................. G03C 7/14
[52] U.S. Cl. ................................... 430/290; 430/291; 430/6; 430/950
[58] Field of Search .................... 430/290, 6, 291, 950

[56] References Cited

U.S. PATENT DOCUMENTS

| | | | |
|---|---|---|---|
| 45,245 | 11/1864 | Cohen et al. | 212/108 |
| 4,229,518 | 10/1980 | Gray et al. | 430/290 |
| 4,247,619 | 1/1981 | Cohen et al. | 430/291 |

*Primary Examiner*—John D. Welsh

[57] ABSTRACT

Process for modifying a tacky surface of a multilayer negative-working surprint proof having a photosensitive tacky layer as the outer layer which comprises exposing the tacky layer through a screen tint, e.g., having a tint value of 25 to 75 percent, and applying an admixture of particulate material and carrier particles and removing excess particulate material and the carrier particles from the tacky surface. The ratio of average particle diameter of the carrier particles to average particle diameter of the particulate material is greater than 2 and the weight ratio of particulate material to carrier particles is less than 1. A durable matte finish is obtained that is nonblocking, is capable of being written on, and is noncracking over extended storage periods.

11 Claims, No Drawings

PROCESS FOR SURFACE IMPROVEMENT OF SURPRINT PROOF INVOLVES EXPOSURE THRU HALFTONE SCREEN TINT

DESCRIPTION

1. Technical Field

This invention relates to a process for modifying the surface of a surprint proof. More particularly, this invention relates to a process for modifying a tacky photosensitive outer layer of a negative-working surprint proof by exposing the tacky photosensitive layer through a screen tint and applying an admixture of particulate material and carrier particles to the exposed layer.

2. Background Art

Photosensitive materials used in the preparation of surprint color proofs are of the positive-working or negative-working types. A negative-working process for preparing surprint proofs is described in Cohen and Fan U.S. Pat. No. 4,174,216. Negative-working elements useful in the negative-working process comprise a support, a tacky, nonphotosensitive contiguous layer, a photohardenable photoadherent layer and a strippable cover sheet. After imagewise exposure to actinic radiation the cover sheet is peeled away together with the exposed areas of the photoadherent layer revealing the tacky contiguous layer beneath. The photoadherent layer in the unexposed image areas remains as a resist over the complementary portions of the contiguous layer. The tacky contiguous layer revealed in the exposed image areas is then toned with pigment. Layers toned with different pigments can be applied in registration over one another to form multilayer surprint color proofs. A tacky photosensitive layer generally is present as the outer layer of the proof. Dependent on the thickness of the layers, the proof may exhibit a pronounced undesirable three-dimensional effect. The multilayer surprint proofs having a positive-working photosensitive outer layer upon ageing exhibit cracks or crazes in the surface thereof.

Methods are known by which negative-working materials can be provided with matte finishes. Sprays have been used containing delustering agents but are messy, involve hazardous, flammable sprays, often do not cover the layer properly, yield a poor matte finish and the solvents may attack the image-forming layer. An advantageous process for providing a matte finish on negative-working multicolor surprint proofs is described and claimed in Cohen and Fan U.S. Ser. No. 045,245, filed June 4, 1979, now U.S. Pat. No. 4,286,046 dated Aug. 25, 1981. It was found by Cohen and Fan that by applying at least one layer of colloidal silica from a substantially aqueous dispersion and drying the layer to a dry coating weight of at least 20 mg/dm$^2$ the three-dimensional effective is eliminated, and the surprint surface is hard and nonblocking, i.e., surfaces that are brought into contact therewith do not adhere. The wet methods for applying the matte finish are disadvantageous for the color proofer since a coater and the necessary solutions are required with the inherent storage and cleanup problems. It is therefore desired that a method not requiring liquid or aqueous solutions be provided whereby the degree of matte of a tacky surface on a multilayer negative-working surprint proof can be effectively controlled, the three-dimensional effect be eliminated, a durable, nonblocking surface be provided, and the cracking or crazing properties of the proof be improved.

DISCLOSURE OF THE INVENTION

In accordance with this invention there is provided in a process for modifying a tacky surface of a surprint multicolor proof having at least two nonplanar, nonsilver halide, negative-working colored photoimaged elements sequentially bonded to a support, and a photosensitive tacky layer present as the outer layer of the proof which comprises (1) applying to the tacky surface an admixture of particulate material and carrier particles, the ratio in the admixture of the average particle diameter of carrier particles to that of the particulate material in the admixture being greater than 2 and the weight ratio of particulate material to carrier particles being less than 1, and (2) removing excess particulate material and the carrier particles from the tacky surface, the improvement wherein prior to application to the tacky surface of the admixture of particulate material and carrier particles the photosensitive tacky layer is exposed through a screen tint.

In practicing the process of the invention the tacky surface of the negative-working surprint proof that is modified and improved is a photosensitive tacky layer of a positive-working photohardenable element. Tacky positive-working photohardenable elements (photohardenable layer between two removable films) are described, for example, in U.S. Pat. No. 3,649,268 which is incorporated by reference. Positive-working elements are those wherein the photosensitive layer becomes hardened and nontacky in the exposed imaged areas and remains tacky in the unexposed areas. Generally the photohardenable layer contains at least one free-radical initiated, chain-propagating, addition polymerizable compound containing at least one terminal ethylenic group, and an addition polymerization initiator activatable by actinic radiation, and optionally a compatible macromolecular organic polymeric binder. The tacky positive-working photohardenable element, after removal of one film, is present over the negative-working surprint proof, for example, of the type described in U.S. Pat. No. 4,174,216 which is incorporated by reference.

Negative-working surprint elements are elements wherein at least two photosensitive elements that have been imaged and colored with different colorants (nonplanar, nonsilver halide, colored, photoimaged elements) are sequentially laminated or bonded to a suitable support surface, e.g., paper, film, etc. In forming a surprint element, the cover sheet and any sheet support present in the photosensitive elements are removed. Preferred negative-working elements comprise, in order from top to bottom, (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and optionally (4) a sheet support. A positive-working photohardenable element, as described above is applied to the outermost colored photoimaged element of the surprint element.

Generally, the surprint element has over its support four imaged colored photopolymer elements, e.g., yellow, magenta, cyan, black, and an optional fifth nonimaged photopolymer element. Colorants and toners used in preparing the surprints are described in U.S. Pat. No. 3,620,726, 3,909,326 and Manger et al. Application Ser. No. 091,889, filed Nov. 7, 1979, which are incorporated by reference.

After the negative-working multicolor surprint proof with the positive-working photohardenable element present thereon is prepared, the surprint proof is exposed through a screen tint as described more fully below, the protective film of the exposed positive-working element is removed and an admixture of particulate material and carrier particles is applied to the exposed tacky surface. The admixture of particulate material and carrier particles is prepared by intimately mixing by known methods carrier particles of average diameter suitable for the tacky surface and a predetermined amount of particulate material. The admixture can be applied to the tacky surface by use of a fiber pad dipped into the admixture and wiped over the tacky surface or by an applicator such as described in Sandner U.S. Pat. No. 4,019,821, incorporated by reference. The "glossiness" of the treated surface is plotted in gloss units determined by means of a Photoelectric Glossmeter, Model 610, Photovolt Corp., 1115 Broadway, New York, New York. By varying the weight ratios of particulate material to carrier particles the degree of matte on the surprint proof proof can be controlled. Particulate material in the range of less than 50% by weight in the admixture provide the highest degree of matte (lowest amount of gloss). By utilizing progressively less particulate material in the admixture with the carrier particles, an operator can modify the tacky surface to any degree of matte that is desired.

The carrier particles are generally transparent or translucent, inert, i.e., nonelectroscopic, spheroidal-shaped solid polymer particles with an average diameter of from about 10 to 100$\mu$. The particle size can be measured, for example, by a Coulter Counter, Coulter Electronics, Inc., Hialeah, Florida. The selection of the size of the carrier particles is determined by certain factors. For example, the carrier particles must be large enough to be readily removed from the tacky surface to which they are applied. Conversely, the carrier particles must be small enough so that, together with attached particulate material, the inert carrier particles can be uniformly wiped over the tacky surface. Useful carrier particles include: polymethylmethacrylate, polyethylmethacrylate, polyethylene, polyvinyl chloride, polyvinyl acetate, polystyrene, polyvinyl alcohol, cellulose acetate, and preferably ionic copolymer of $\alpha$-olefins having the formula $R-CH=CH_2$ where R is a radical selected from the class consisting of hydrogen, alkyl of 1 to 8 carbon atoms and $\alpha$, $\beta$-ethylenically unsaturated carboxylic acid having from 3 to 8 carbon atoms, the copolymers having from 10% to 90% of the carboxylic acid groups ionized by neutralization with metal ions uniformly distributed throughout the copolymer.

Admixed with the carrier particles are particulate materials having an average diameter of from 1$\mu$ to 20$\mu$, the ratio of the average diameter of the carrier particles to that of the particulate material being greater than 2 to 1. The size of these particles can also be measured by a Coulter Counter. A useful range of average diameter carrier particles to particulate material is between 2:1 to 30:1. The amount of weight of particulate material in the admixture is also important. The weight ratio of particulate material to carrier particles is less than 1:1. A percent range is between about 0.1 to 50% by weight particulate material to 50 to 99.9% by weight carrier particles. As the ratio of particulate material to carrier particles changes, the degree of matte is altered as noted below. Useful substantially colorless particulate materials, alone or in combination, include: cellulose acetate, polyvinyl alcohol, polyethylene resins, waxes, diatomaceous silica, starches, e.g., rice and corn; talc, etc.; and colored pigments or toners such as those described in U.S. Pat. Nos. 3,620,726; 3,909,326 and Manger et al. application Ser. No. 091,889, filed Nov. 7, 1979, which are incorporated by reference, in combination with the substantially colorless particulate materials. The pigments can be present in an amount 0 to 20% by weight based on the weight of admixture to tint or color the tacky surface. While, surprisingly, the particulate material and carrier particles can be similar in composition, the ratios of average diameter and weight set forth above must be observed.

In Charles and Heiart, U.S. Application Ser. No. 189,829, entitled "Process for Modifying Tacky Surfaces", filed Sept. 23, 1980, there is described the application to tacky surfaces of an admixture of particulate material and carrier particles, the ratio in the mixture of the average particle diameter to carrier particles to that of the particulate material in the mixture being greater than 2 and the weight ratio of particulate material to carrier particles being less than 1. Among the tacky surfaces modified is a tacky photosensitive layer on a negative-working multicolor surprint proof. In the instant process it has been found advantageous to expose the tacky surface, i.e., a positive-working photohardenable layer, generally through a removable protective sheet, through a superimposed screen tint, followed by removal of the protective sheet, when present, and then applying the admixture of particulate material and carrier particles thereto. Excess particulate material and the carrier particles are then removed by procedures known to those skilled in the art. Subsequently the exposed surface may be nonimagewise exposed to actinic radiation to further harden the surface. The exposure can be by various sources rich in ultraviolet radiation known to those skilled in the art, e.g., Berkey-Ascor Vacuum Printer, mercury vapor lamps, pulsed xenon lamps, etc., generally for a period of 10 seconds or more.

Screen tints which can be used to control exposure of the tacky surface are those which have a tint value (positive percent dot area) of 25 to 75 percent with a ruling corresponding to 85 lines to 400 lines per inch (33.46 to 157.5 lines per cm), preferably 225 to 325 lines per inch (88.58 to 127.95 lines per cm). Preferred screen tints are those with a random photographic pattern, referred to in the trade as a "grained tint" or "mezzotint". Also useful are standard ruled tints (halftone screen tints).

BEST MODE FOR CARRYING OUT THE INVENTION

The best most is illustrated in Example 1.

INDUSTRIAL APPLICABILITY

The process of this invention is useful in preparing improved negative-workng multicolor surprint proofs having a positive-working photohardenable protective layer thereon. The tacky treated surface, which is exposed through a screen tint and particulate material/carrier particles mixture applied thereto, has a matte finish, the degree of which can be controlled by the process. The matte surface is durable and nonblocking and is capable of being written on by writing devices such as pencil, pen and crayon. In addition, the resistance to cracking or crazing of the surprint proof is surprisingly lengthened. This is particularly important since surprint proofs are normally retained for extended periods of time, e.g., 2 to 3 months and longer. Without the exposure through the screen tint untreated proofs have been known to crack and craze within 2 to 3 weeks. The multilayer surprint proof is free from the three-dimensional effect and closely simulates a press proof.

EXAMPLES

The following examples illustrate the invention wherein the parts and percentages are by weight.

EXAMPLE 1

A negative-working pre-press color proof of the surprint type is prepared as follows:

I. Nontonable Photopolymerizable Layer

A coating solution of a photopolymerizable composition is prepared by mixing together the following ingredients:

| Ingredient | Weight (g) |
| --- | --- |
| Polymethyl methacrylate (MW 200,000–300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4''')-(naptho-1',2';4,5) 1,2,3-triazol-2''-sulfonic acid phenyl ester | 2.20 |
| 2-Mercaptobenzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm$^2$ when dried on a clear polyethylene terephthalate film having a thickness of 0.0005 inch (0.0015 cm) wich is surface treated by electrostatic discharge at 0.07 coulombs/ft$^2$ (0.093 coulombs/m$^2$).

II. Tonable, Tacky Elastomer Contiguous Layer

A coating solution is prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55–60) | 79.75 |
| Tetra-bis-[methylene 3-(3',5'-di-t-butyl-4'-hydroxyphenyl) proprionate] methane | 0.50 |
| Methylene chloride to make | 1333.30 |

This solution is coated on polyethylene terephthalate film having a releasable layer of polydimethyl siloxane coated thereon to give a coating weight of about 125 mg/dm$^2$ when dried.

III. Laminating Procedure

The supported photopolymerizable layer (I) and the supported tonable, tacky elastomer contiguous layer (II) are laminated in surface-to-surface relationship at room temperature with a pressure of about 40 psi (2.81 kg/dm$^2$).

IV. Operations for Preparation of a Surprint

The laminate (III) is further handled as follows;

The polyethylene terephthalate film with the siloxane release coating is stripped from the tonable, tacky layer and the resulting element is then laminated at 100° C. to a 0.012 inch (0.03 cm) thick paper support (identified as Baryta Paper, marketed by the Intermill Corporation, Belgium). The element is then exposed to a halftone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo ® glass filter (No. 400) Kokomo Opalescent Glass Co., Kokomo, IN. The distance between the lamp and the vacuum frame of this device is about 38 inches (96.52 cm). After the exposure is made, the exposed element is taped securely to a suitable flat surface, and the clear polyethylene terephthalate film cover sheet is stripped by pulling at one corner with an even, continuous motion at an angle of about 135°–180°. The resulting exposed, photopolymerized image photoadheres to the electrostatic discharge treated film and is removed with the film thus exposing equivalent areas of the tacky, elastomer contiguous layer on the paper support. The bared areas of the contiguous layer are toned using a yellow toner, Dalamar ® Yellow (Pigment Yellow 74, C.I. No. 11741) prepared according to Example 9 of Manger et al. U.S. Pat. 4,215,193. A second laminate (III) having its polyethylene terephthalate film with release coating removed as described above is laminated to the surface of the yellow image and is exposed to a halftone, negative, minus-green color separation film record in registration. The clear, surface treated polyethylene terephthalate film of the second laminate is stripped from the contiguous layer leaving bared an image which is toned with a magenta toner, a dispersion consisting of 50 percent mixture of quinacridone magenta, Quindo Magenta (C.I. Pigment Red 122) and Indo Brilliant Scarlett toner (Pigment Red 123, C.I. #71145) and 50 percent cellulose acetate, prepared as described in Example 11 of U.S. Pat. 4,215,193. The process is then repeated for the minus-red, (phthalocyanine cyan toner, a dispersion of 50 percent mixture of Monastral ® Blue G (Copper Phthalocyanine Pigment Blue 15, C.I. #74260) and 50 percent cellulose acetate prepared as described in Example 1 of U.S. Pat. No. 4,215,193), and black, Carbon Black, Sterling NS N774 (C.I. Pigment Black 7, C.I. #77266 prepared as described in Example 10 of U.S. Pat. No. 4,215,193), negative records. This procedure yields a four-color negative surprint proof. Onto the outer surface of the four-color proof is laminated at 110° C. a positive-working photopolymer element of a 0.0003 inch (0.008 mm) layer and a 0.001 inch (0.025 mm) thick polyethylene terephthalate support. The photopolymer layer is prepared by mixing together the following ingredients:

| Ingredient | Amount (parts) |
| --- | --- |
| Polymethylmethacrylate, molecular weight 30,000, density 1.13 g/cc | 32.40 |

| Ingredient | Amount (parts) |
| --- | --- |
| Trimethylolpropane trimethacrylate | 35.60 |
| 2-o-Chlorophenyl-4,5-bis-(m-methoxyphenyl) imidazolyl dimer | 1.58 |
| 2-Mercaptobenzothiazole | 0.79 |
| Polyoxyethylene lauryl ether | 7.90 |

The mixture is dissolved in methylene chloride (20% solution) and is coated onto a 0.001 inch (.0025 cm) thick polyethylene terephthalate support.

The four-color surprint proof having the positive-working photopolymer element thereon is returned to the exposure device described above. Over the positive-working photopolymer element is placed a screen tint (mezzotint) with a 55 positive percent dot area derived from a Policrom ® GKKK Neutral Grey Fine Grain Screen manufactured by Policrom Photo Products S.p.A. Bergamo, Italy. Vacuum is applied for about one minute and the element is exposed for about 15 seconds (dot for dot rendition). The exposed element is removed from the vacuum frame, and the polyethylene terephthalate support is removed. An admixture of particulate cellulose acetate (4 g, about 5μ average diameter) and Surlyn ® ionomer resin beads (carrier particles) manufactured by E. I. du Pont de Nemours and Company, Wilmington, Delaware (16 g, about 25μ average diameter) is applied to the exposed photopolymer surface by means of a fiber pad dipped into the admixture. The surface is wiped with a cotton cloth to remove excess cellulose acetate and all the carrier particles. The four-color proof has a uniform matte finish which is clean, dry and resembles a press sheet. The finish is durable, is nonblocking, and is capable of being written on with pencil, pen or crayon. The prepared proofs show no deterioration due to cracking or crazing for a period of at least three months at ambient temperature.

EXAMPLE 2

Example 1 is repeated except that in place of the 55 positive percent dot area screen tint is used a 25 positive percent dot area screen tint derived from a similar screen as described in Example 1. The resultant proof exhibits the same desirable features with a lesser degree of matte.

EXAMPLE 3

Example 1 is repeated except that the positive-working photopolymer element with the screen tint in place is exposed for 30 seconds in the exposure device described in Example 1. The resultant proof exhibits the same desirable features with a lesser degree of matte.

I claim:

1. In a process for modifying a tacky surface of a surprint multicolor proof having at least two nonplanar, nonsilver halide, negative-working colored photoimaged elements sequentially bonded to a support, and a photosensitive tacky layer present as the outer layer of the proof which comprises
   (1) applying to the tacky surface an admixture of particular material and carrier particles, the ratio in the admixture of the average particle diameter of carrier particles to that of the particulate material in the admixture being greater than 2 and the weight ratio of particulate material to carrier particles being less than 1, and
   (2) removing excess particulate material and the carrier particles from the tacky surface,
the improvement wherein prior to application to the tacky surface of the admixture of particulate material and carrier particles the photosensitive tacky layer is exposed through a screen tint.

2. A process according to claim 1 wherein the tacky layer is a photohardenable layer containing at least one free-radical initiated, chain propagating, addition polymerizable compound containing at least one terminal ethylenic group, and an addition polymerization initiator activatable by actinic radiation, and, optionally a compatible macromolecular organic polymeric binder.

3. A process according to claim 1 or claim 2 wherein a protective sheet is present on the tacky layer during the exposure, the protective sheet being removed prior to application of the admixture of particulate material and carrier particles.

4. A process according to claim 1 wherein the particulate material is cellulose acetate.

5. A process according to claim 1 wherein the carrier particles are an ionic copolymer.

6. A process according to claim 1 wherein the admixture of the particulate material and carrier particles contains particulate pigment material.

7. A process according to claim 1 wherein the negative-working photoimage elements, prior to exposure, comprise a photoadherent layer comprising a nontacky photohardenable material with ethylenically unsaturated or benzophenone type groups, and a contiguous layer of a nonphotosensitive, tacky organic material.

8. A process according to claim 7 wherein each colored photoimaged element have been exposed through a different color separation negative and the respective photoadherent layers have been colored in a spectral region corresponding to the color separation negative used for the exposure.

9. A process according to claim 8 wherein four negative-working photoimaged elements are present in the surprint multiprint proof, and the elements and colored separation negatives correspond, respectively, to yellow, magenta, cyan and black.

10. A process according to claim 1 wherein the screen tint is a halftone screen tint having a tint value of 25 to 75 percent with a screen ruling of 85 to 400 lines per inch.

11. A process according to claim 1 wherein the screen tint has a tint value of 25 to 75 percent with a random pattern corresponding to 85 to 400 lines per inch.

* * * * *